(12) United States Patent
Arsovski

(10) Patent No.: US 8,130,525 B2
(45) Date of Patent: Mar. 6, 2012

(54) METHOD AND APPARATUS FOR CONFIGURING A CONTENT-ADDRESSABLE MEMORY (CAM) DESIGN AS BINARY CAM OR TERNARY CAM

(75) Inventor: Igor Arsovski, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 12/576,275

(22) Filed: Oct. 9, 2009

(65) Prior Publication Data

US 2011/0088005 A1  Apr. 14, 2011

(51) Int. Cl.
  *G11C 15/00* (2006.01)
  *G06F 13/00* (2006.01)
(52) U.S. Cl. .................. 365/49.11; 365/49.17; 711/108
(58) Field of Classification Search ............. 365/49.11, 365/49.12, 49.17, 49.1; 711/108
  See application file for complete search history.

(56) References Cited

U.S. PATENT DOCUMENTS

| | | | |
|---|---|---|---|
| 6,169,685 B1 | 1/2001 | Gandini et al. | |
| 6,704,216 B1 * | 3/2004 | Cheng et al. | 365/49.17 |
| 6,707,692 B2 | 3/2004 | Hata | |
| 7,054,995 B2 | 5/2006 | Chow et al. | |
| 7,230,840 B2 | 6/2007 | Pereira et al. | |
| 7,298,635 B1 * | 11/2007 | Maheshwari | 365/49.17 |
| 7,324,362 B1 | 1/2008 | Maheshwari | |
| 7,350,019 B2 | 3/2008 | Wakimoto et al. | |
| 7,433,217 B1 * | 10/2008 | Maheshwarl | 365/49.17 |
| 2002/0080638 A1 * | 6/2002 | Hata | 365/49 |
| 2011/0049656 A1 * | 3/2011 | Li et al. | 257/421 |

* cited by examiner

*Primary Examiner* — VanThu Nguyen
*Assistant Examiner* — Khamdan Alrobaie
(74) *Attorney, Agent, or Firm* — Gibb I.P. Law Firm, LLC; David A. Cain, Esq.

(57) ABSTRACT

A method for producing a configurable content-addressable memory (CAM) cell design, in which the method includes: inputting the configurable CAM cell design to a computer, the configurable CAM cell design capable of being configured as one of a binary CAM design and a ternary CAM design, depending on connections of a metal overlay; selecting one of a first metal overlay design for the binary CAM design and a second metal overlay design for a ternary CAM design; if the first metal overlay design is selected, then combining the first metal overlay design with the configurable CAM cell design to produce a binary CAM design including two binary CAM cells with a single search port, and outputting the binary CAM design; and if the second metal overlay design is selected, then combining the second metal overly design with the configurable CAM cell design to produce a ternary CAM design including a single ternary CAM cell with two search ports, and outputting the ternary CAM design by the computer.

19 Claims, 11 Drawing Sheets

Configurable CAM cell design configured as two binary CAM cells

FIG. 1 (3 x 4) bit binary CAM
(Prior Art)

FIG. 2 (3 x 4) bit ternary CAM (Prior Art)

FIG. 3 SRAM-based binary CAM cell
(Prior Art)

FIG. 4 SRAM-based ternary CAM cell (Prior Art)

FIG. 5 Configurable CAM cell design configured as two binary CAM cells

FIG. 6 Configurable CAM cell design configured as single ternary CAM cell with two search ports

FIG. 7 Outputs of Ternary and Binary CAM

FIG. 8 Inputs to Binary CAM

FIG. 9 Inputs to Ternary CAM

METHOD AND APPARATUS FOR CONFIGURING A CONTENT-ADDRESSABLE MEMORY (CAM) DESIGN AS BINARY CAM OR TERNARY CAM

BACKGROUND

1. Field of the Invention

The embodiments of the invention generally relate to a method and apparatus for configuring a configurable content-addressable memory (CAM) as either binary CAM or ternary CAM. More specifically, the embodiments of the invention use a selected metal overlay combined with the configurable CAM cell design to produce either binary CAM including two binary CAM cells or ternary CAM including a single ternary CAM cell with two search ports.

2. Description of the Related Art

In standard computer memory, e.g., random access memory (RAM), a user provides a memory address and the RAM returns a data word stored at the memory address. In contrast to standard computer memory, content-addressable memory (CAM) receives a data word from the user and searches the entire CAM memory, in a single operation, to determine whether the data word is stored anywhere within the CAM memory. Because CAM searches its entire memory in a single operation, it is much faster than RAM in search applications. However, there are cost disadvantages to CAM. Unlike a RAM chip, which has simple storage cells, each individual memory bit of a data word stored in CAM must have an associated comparison circuit to detect a possible match between each individual memory bit of the stored data word and an inputted search bit of a searched for data word. In addition, matched outputs from each individual memory bit of the stored data word must be combined with the outputs of other individual memory bits of the stored data word by additional circuitry in order to complete a data word match. This additional circuitry further increases the size and manufacturing cost of a CAM integrated circuit.

There are two types of CAM: binary CAM and ternary CAM. Binary CAMs provide for the storing and searching of binary bits, i.e., zero and one (0, 1), comprising a data word. Ternary CAMs provide for the storing of three states, i.e., zero, one, and a "don't care" bit (0, 1, X). The "don't care" bit of ternary CAM allows for increased accommodation in searching data words. For example, a ternary CAM may store the data word, "11XX0", which will match any of the searched for data words, "11000", 11010", "11100", and "11110". The increased accommodation in searching data words with ternary CAM, however, requires additional circuitry for each individual bit of the stored data word in order to provide the three possible states. This additional circuitry results in a larger size and greater cost for ternary CAM cells, as compared to binary CAM cells.

CAM is often used in computer network devices. For example, when a network switch receives a data frame from one of its ports, it updates an internal address table with the frame's source address and the receiving port's identifier. The network switch then looks up the destination address of the data frame in the internal address table to determine to which port the data frame should be forwarded, and sends the data frame to its destination address on that port. The internal address table is usually implemented by a binary CAM so that the data frame is quickly forwarded to the proper port, reducing the network switch's latency.

Ternary CAMs are frequently used in network routers, where each address has a network address, which varies in size depending on the subnet configuration, and a host address, which occupies the remaining bits. The network address and the host address are distinguished by a network mask for each subnet of the network. Routing information to its destination in the network requires a router to look up a routing table, which contains each known destination address, the associated network mask, and routing information needed to route packets to the destination address. Routing is performed rapidly by a ternary CAM, which masks the host portion of the address with "don't care" bits. Ternary CAM, which masks the host address and compares the destination address in one operation, quickly retrieves the routing information needed to route packets to the destination address.

FIG. 1 illustrates a simplified block diagram of a conventional 3×4 bit binary CAM. The binary CAM cells are arranged into three horizontal words, each four bits long. The binary CAM cells contain both storage and comparison circuitry. The vertically paired search-lines apply, in parallel, the bits, 0 or 1, of the search data word to the binary CAM cells. The match-lines, which run horizontally, compare whether each bit of the search data word matches each bit of the stored data word of a row of binary CAM cells. If a match occurs, the match-line indicates a match.

FIG. 2 illustrates a simplified block diagram of a conventional 3×4 bit ternary CAM. Like the binary CAM cells of FIG. 1, the ternary CAM cells of FIG. 2 are arranged into three horizontal words, each four bits long. Similarly, the vertically paired search-lines apply, in parallel, the bits, 0 or 1, of the search data word to the ternary CAM cells. However, the storage and comparison circuitry of the ternary CAM cells may also store the "don't care" bit, X, and compare each individual "don't care" bit with a corresponding bit of the applied search data word. As indicated by FIG. 2, the presence of "don't care" bits in two of the three stored data words, allows two of three of the match-lines to be activated.

Referring to FIGS. 1 and 2, a binary or ternary CAM search begins with pre-charging all match-lines high, putting them all temporarily into the match state. Next, the search-line drivers broadcast the search data word onto the search-lines. Then, each CAM cell compares its stored bit or state against the bit on its corresponding search-lines. CAM cells with matching bits do not affect the match-line, but CAM cells with a mismatch pull the match-line down to ground. Ternary CAM cells storing an X operate as if a match had occurred. The aggregate result is that match-lines are pulled down for any search data word that has at least one individual bit mismatch. All other match-lines remain activated, i.e., high.

FIG. 3 illustrates a conventional static random access memory (SRAM)-based binary CAM cell. Two access transistors connect the word bit lines, WBL and $\overline{\text{WBL}}$, to the storage data nodes, $\overline{\text{D}}$ and D, which store the data using positive feedback in back-to-back inverters of a conventional SRAM cell under control of the wordline, WWL. The comparison circuitry attached to the storage data nodes compares the data in the binary CAM cell with the data on the search-lines, SL and $\overline{\text{SL}}$. A mismatch in a binary CAM cell creates a path to ground from the match-line through one of the series of transistor pairs. This conventional binary CAM cell comprises 10 transistors.

FIG. 4 illustrates a conventional SRAM-based ternary CAM cell. The ternary CAM cell stores an extra state compared to the binary CAM cell, the "don't care" state, which requires two storage cells. The conventional ternary CAM search operation compares the stored data word at data nodes, D0, D1, to the search data word on the search-lines SLx, SLy). The ternary CAM cell may be likened to a truth table with three entries, where D0=0 and D1=1 yields a truth state of "0", D0=1 and D1=0 yields a truth state of "1", and D0=0 and D1=0 yields the "don't care" state, "X". The state D0=1 and D1=1 is undefined and is not used. This conventional ternary CAM cell comprises 16 transistors.

Computer network devices benefit from both binary CAM and ternary CAM in their respective functions. However, binary CAM cannot be used to implement ternary CAM, because it lacks the additional circuitry for storing and comparing the "don't care" state. Although ternary CAM may be used to implement a binary CAM result, such a use is costly because of the 16 transistors per bit overhead for a ternary CAM cell, when compared to the 10 transistors per bit of the binary CAM cell.

Conventional hardware compliers do not allow for an efficient and economic admixture of binary CAM and ternary CAM in networking integrated circuits. However, the higher performance capability of ternary CAM to prevent bottlenecks in increasingly larger and faster networks and the inexpensive requirements of binary CAM to point to a content address, argue for the efficient and economic admixture of binary CAM and ternary CAM in today's network devices.

SUMMARY

In view of the foregoing, various embodiments of the invention provide a simple configurable content-addressable memory (CAM) design to be configured as either a binary CAM design or a ternary CAM design by combining the configurable CAM cell design with a selectable metal overlay to produce one of either a binary CAM design including two binary CAM cells with a single search port that provides twice the cell density when compared to the configured ternary CAM design, or a ternary CAM design including a single ternary CAM cell with two search ports that provides twice the throughput when compared to the configured binary CAM design. In addition, each of the configured binary CAM design and the configured ternary CAM design efficiently uses every one of the twenty transistors of the configurable CAM design of various embodiments of the invention.

An exemplary embodiment of the invention provides a computer-implemented method for configuring a configurable content-addressable memory (CAM) cell design, in which the method includes: inputting the configurable CAM cell design to a computer, the configurable CAM cell design capable of being configured as one of a binary CAM design and a ternary CAM design, depending on connections of a metal overlay; selecting one of a first metal overlay design for the binary CAM design and a second metal overlay design for a ternary CAM design, using the computer; if the first metal overlay design is selected, then combining, by the computer, the first metal overlay design with the configurable CAM cell design to produce a binary CAM design including two binary CAM cells with a single search port, and outputting the binary CAM design by the computer; and if the second metal overlay design is selected, then combining, by the computer, the second metal overly design with the configurable CAM cell design to produce a ternary CAM design including a single ternary CAM cell with two search ports, and outputting the ternary CAM design by the computer.

Another exemplary embodiment of the invention provides a computer-implemented method for producing a configurable content-addressable memory (CAM) cell design, in which the method includes: inputting, to a computer, a configurable CAM cell design, the configurable CAM cell design comprising: a first sub-cell design comprising a static random access memory (SRAM)-based ternary CAM cell connected to a first pair of search-lines and a first match-line output; and a second sub-cell design comprising comparison circuitry connected to a second pair of search-lines and a second match-line output; selecting, by using the computer, one of a first metal overlay design and a second metal overlay design to electrically connect the first and second sub-cell designs as one of a binary CAM design including two binary CAM cells with a single search port, and a ternary CAM design including a single ternary CAM cell with two search ports, respectively; wherein the first metal overlay design comprises: connections between storage data nodes of a first binary CAM cell, and the first match-line output and the second match-line output; and connections between storage data nodes of a second binary CAM cell, and the first match-line output and the second match-line output; and wherein the second metal overlay design comprises: parallel connections between storage data nodes producing a first ternary CAM cell output and a second ternary CAM cell output, and the first match-line output and the second match-line output, respectively; and outputting, by the computer, one of the binary CAM design including two binary CAM cells with a single search port, and the ternary CAM cell design including a single ternary CAM cell with two search ports according to the selecting of the first or the second metal overlay design, respectively.

Yet another exemplary embodiment of the invention provides that the first metal overlay design further comprises an AND gate that receives an output from each of the two binary CAM cells.

Yet another exemplary embodiment of the invention provides that the second metal overlay design further comprises the first and second match-line outputs connecting to a first search port and a second search port, respectively, of the configured single ternary CAM cell with two search ports.

Yet another exemplary embodiment of the invention provides that the first metal overlay design further comprises connections between inputs to data storage nodes of the first binary CAM cell to the first and second match-line outputs, and connections between inputs to data storage nodes of the second binary CAM cell to the first and second match-line outputs.

Yet another exemplary embodiment of the invention provides that the second metal overlay design further comprises connections between inputs to data storage nodes, producing a first ternary CAM cell output and a second ternary CAM cell output, and the first and second match-line outputs, respectively.

Yet another exemplary embodiment of the invention provides that the first sub-cell design comprises 16 transistors.

Yet another exemplary embodiment of the invention provides that the second sub-cell design comprises 4 transistors.

Yet another exemplary embodiment of the invention provides a computer system for producing a configurable content-addressable memory (CAM) design, in which the system includes: a memory configured to: store the configurable CAM cell design, the configurable CAM cell design comprising: a first sub-cell design comprising a static random access memory (SRAM)-based ternary CAM cell connected to a first pair of search-lines and a first match-line output; and a second sub-cell design comprising comparison circuitry connected to a second pair of search-lines and a second match-line output; and a processor configured to: select one of a first metal overlay design and a second metal overlay design to electrically connect the first and second sub-cell designs as one of a binary CAM design including two binary CAM cells with a single search port, and a ternary CAM design including a single ternary CAM cell with two search ports, respectively; wherein the first metal overlay comprises: connections between storage data nodes of a first binary CAM cell, and the first match-line output and the second match-line output; and connections between data storage nodes of a second binary CAM cell, and the first match-line output and the second match-line output; and wherein the second metal overlay comprises: parallel connections between storage data nodes producing a first ternary CAM cell output and a second ternary CAM cell output, and the first match-line output and the second match-line output, respectively; and output one of the binary CAM design including two binary CAM cells with a single search port, and the ternary CAM cell design including a single ternary CAM cell with two search ports according to a selection of the first or the second metal overlay design, respectively.

Yet another exemplary embodiment of the invention provides a computer program storage medium readable by a computer, tangibly embodying a computer program of instructions executable by the computer to perform a method for producing a configurable content-addressable memory (CAM) design, in which the method includes: inputting a configurable CAM cell design, the configurable CAM cell design comprising: a first sub-cell design comprising a static random access memory (SRAM)-based ternary CAM cell connected to a first pair of search-lines and a first match-line output; and a second sub-cell design comprising comparison circuitry connected to a second pair of search-lines and a second match-line output; selecting one of a first metal overlay design and a second metal overlay design to electrically connect the first and second sub-cell designs as one of a binary CAM design including two binary CAM cells with a single search port, and a ternary CAM design including a single ternary CAM cell with two search ports, respectively; wherein the first metal overlay design comprises: connections between storage data nodes of a first binary CAM cell, and the first match-line output and the second match-line output; and connections between storage data nodes of a second binary CAM cell, and the first match-line output and the second match-line output; and wherein the second metal overlay comprises: parallel connections between storage data nodes, corresponding to a first ternary CAM cell output and a second ternary CAM cell output, and the first match-line output and the second match-line output, respectively; and outputting one of the binary CAM design including two binary CAM cells with a single search port, and the ternary CAM cell design including a single ternary CAM cell with two search ports, according to the selecting of the first or the second metal overlay design, respectively.

BRIEF DESCRIPTION OF THE DRAWINGS

The embodiments of the invention will be better understood from the following detailed description with reference to the drawings, which are not necessarily drawing to scale and in which.

DETAILED DESCRIPTION OF PREFERRED EMBODIMENTS OF THE INVENTION

Figure 1:
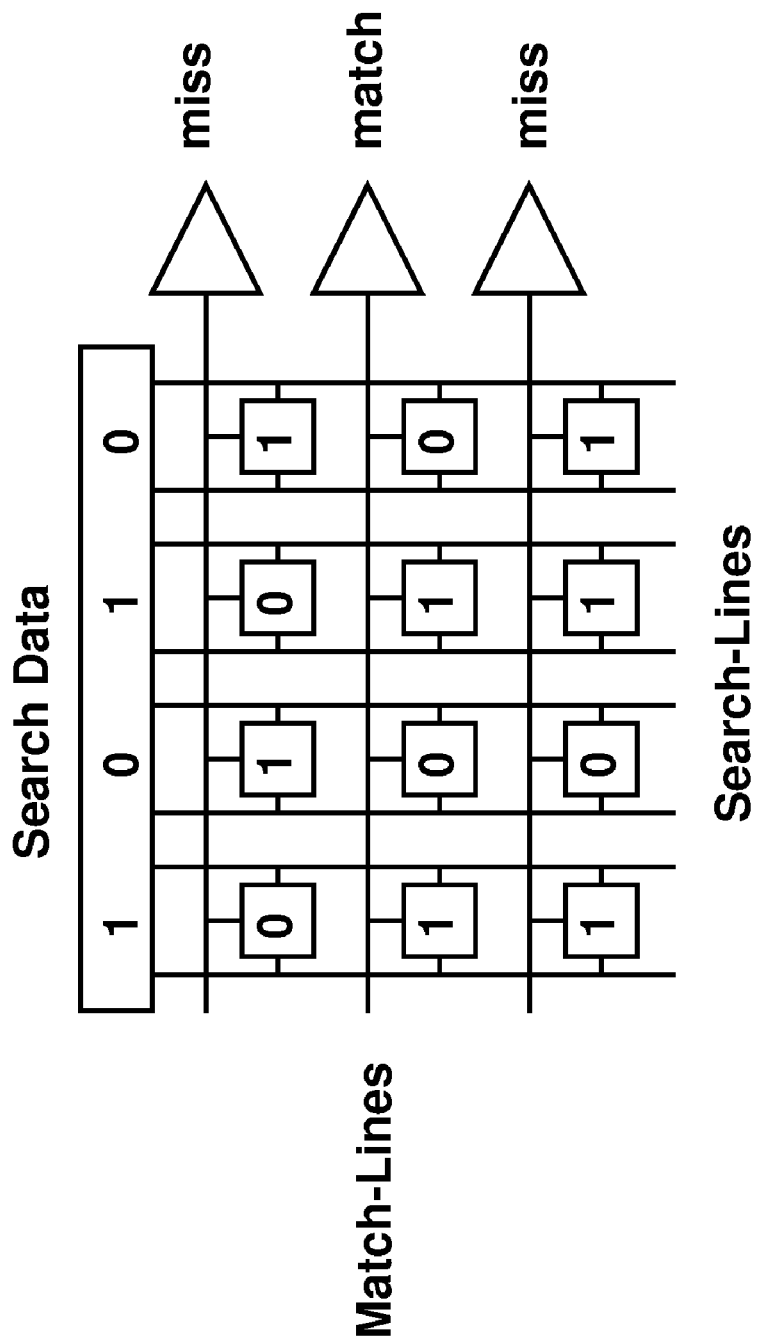
FIG. 1 illustrates a simplified block diagram of a conventional 3×4 bit binary content-addressable memory (CAM) of the related art.
Figure 2:
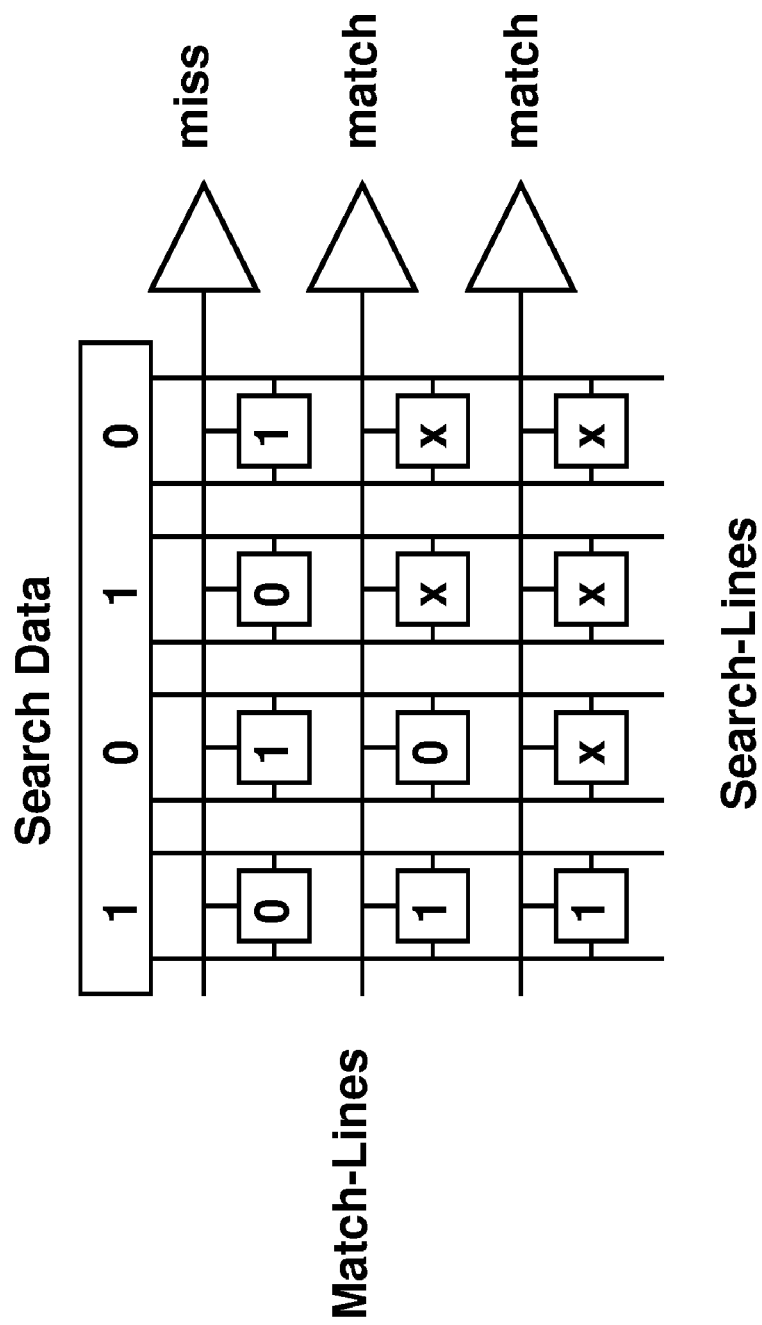
FIG. 2 illustrates a simplified block diagram of a conventional 3×4 bit ternary CAM of the related art.
Figure 3:
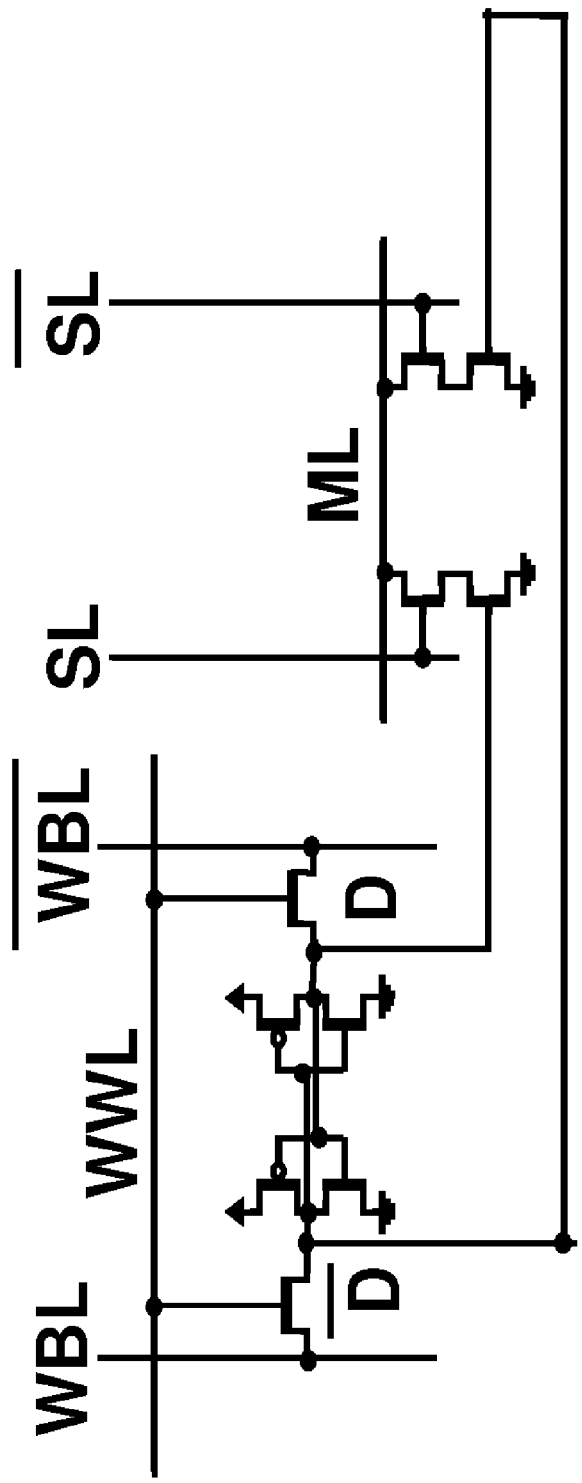
FIG. 3 illustrates a simplified block diagram of a conventional static random access memory (SRAM)-based binary CAM cell of the related art.
Figure 4:
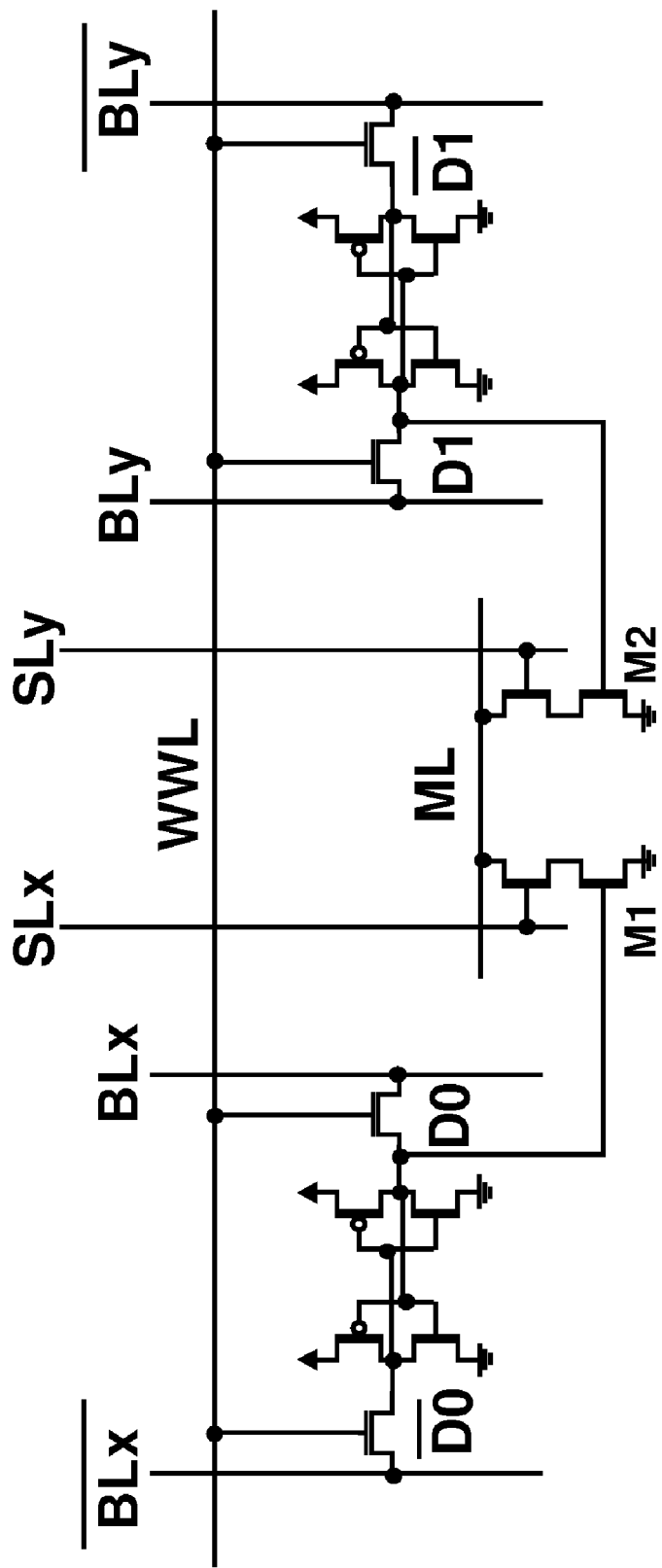
FIG. 4 illustrates a simplified block diagram of a conventional SRAM-based ternary CAM cell of the related art.

The embodiments of the invention and the various features and advantageous details thereof are explained more fully with reference to the non-limiting embodiments of that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the embodiments of the invention. The examples used herein are intended to merely facilitate an understanding of ways in which the embodiments of the invention may be practiced and to further enable those of skill in the art to practice the embodiments of the invention. Accordingly, the examples should not be construed as limiting the scope of the embodiments of the invention.

As stated above, the higher performance capability of ternary CAM to prevent bottlenecks in increasingly larger and faster networks and the inexpensive requirements of binary CAM to point to a content address, argue for the efficient and economic admixture of binary CAM and ternary CAM in today's network devices.

Various embodiments of the invention may provide a simple configurable content-addressable memory (CAM) cell design to be configured as either binary CAM or ternary CAM by combining the configurable CAM cell design with a selected metal overlay, which provides one of either a binary CAM or a ternary CAM. In an exemplary embodiment, the simple configurable CAM cell design and the selected metal may overlay allow hardware compiling of either binary CAM or ternary CAM, with but a small area overhead in size of the configurable CAM cell design when compared to the conventional ternary CAM cell.

Figure 5:
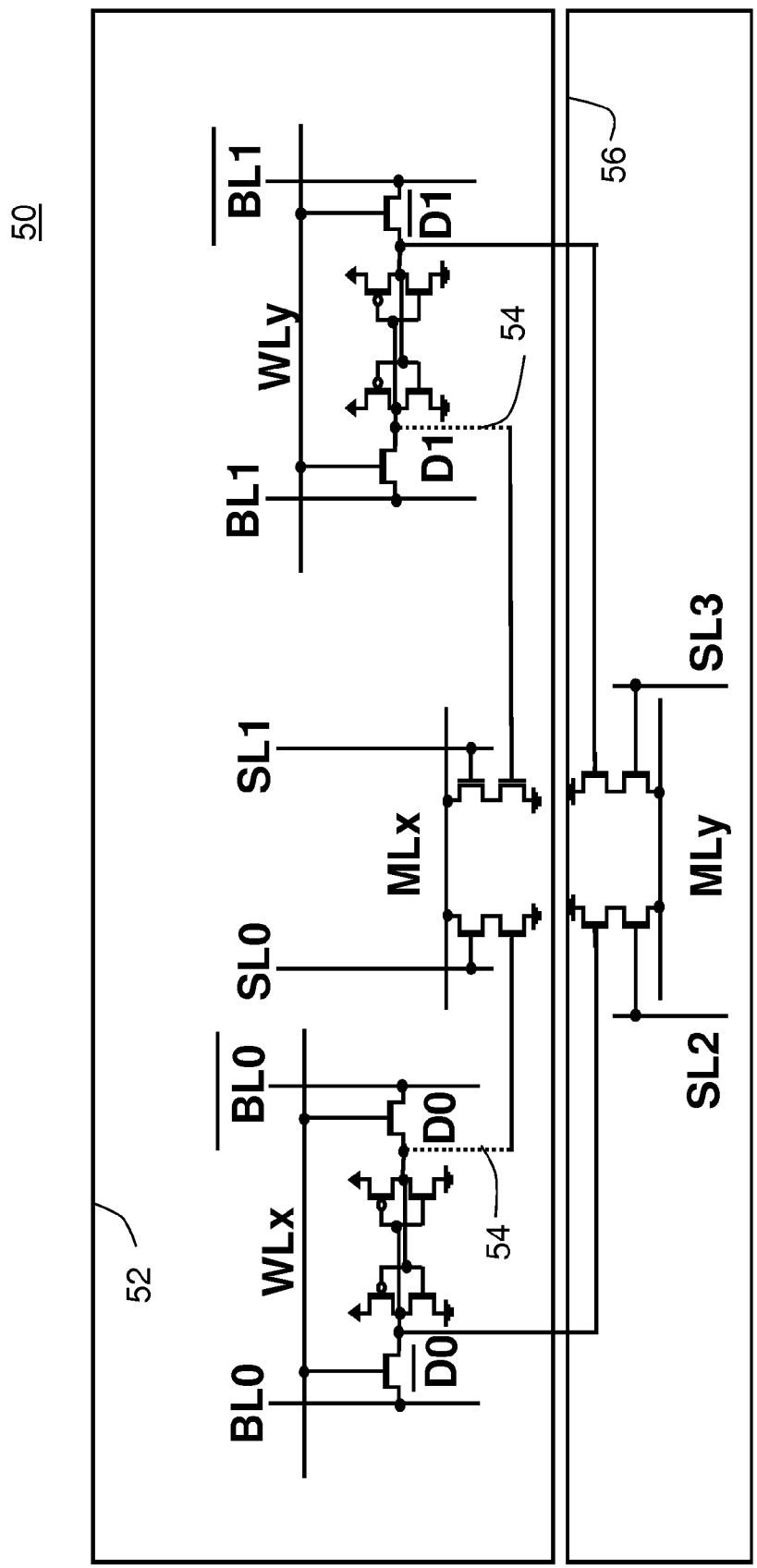
FIG. 5 illustrates a simplified block diagram of a configurable CAM cell design that is configured as two binary CAM cells in an exemplary embodiment of the invention.

FIG. 5 illustrates a configurable CAM cell design of an exemplary embodiment of the invention configured as a binary CAM design 50. Alternatively, as described below, the configurable CAM cell design of an exemplary embodiment of the invention may be configured as one ternary CAM cell with two search ports. In the case of the binary CAM design 50, the configurable CAM cell design 50 may comprise a first sub-cell design 52 including the 16 transistors of a conventional SRAM-based ternary CAM cell, and an additional 4 transistors 56 that when configured may result in a single port binary CAM design 50, which has twice the bit-count of the conventional ternary CAM cell.

When configured as two binary cells, data storage node D0 connects to comparison circuitry associated with search-line SL0 and match-line MLx by a selected metal overlay design 54 (dotted line), and data storage node $\overline{D0}$ connects to comparison circuitry associated with search-line SL2 and match-line MLy; thus, configuring a first binary CAM cell. Similarly, storage data nodes, D1, is connected by the selected metal overlay design 54 (dotted line) to the comparison circuitry associated with search-line SL1 and match-line MLx, while data storage node $\overline{D1}$ connects to the comparison circuitry associated with search-line SL3 and match-line MLy, respectively; thus, configuring a second binary CAM cell. Hence, storage nodes, D0 and $\overline{D0}$, and match-lines MLx and MLy may provide one binary CAM cell, and storage nodes D1 and $\overline{D1}$, and match-lines MLx and MLy may provide a second binary CAM cell of the configurable CAM cell design configured as a binary CAM design 50 of the invention.

Figure 6:
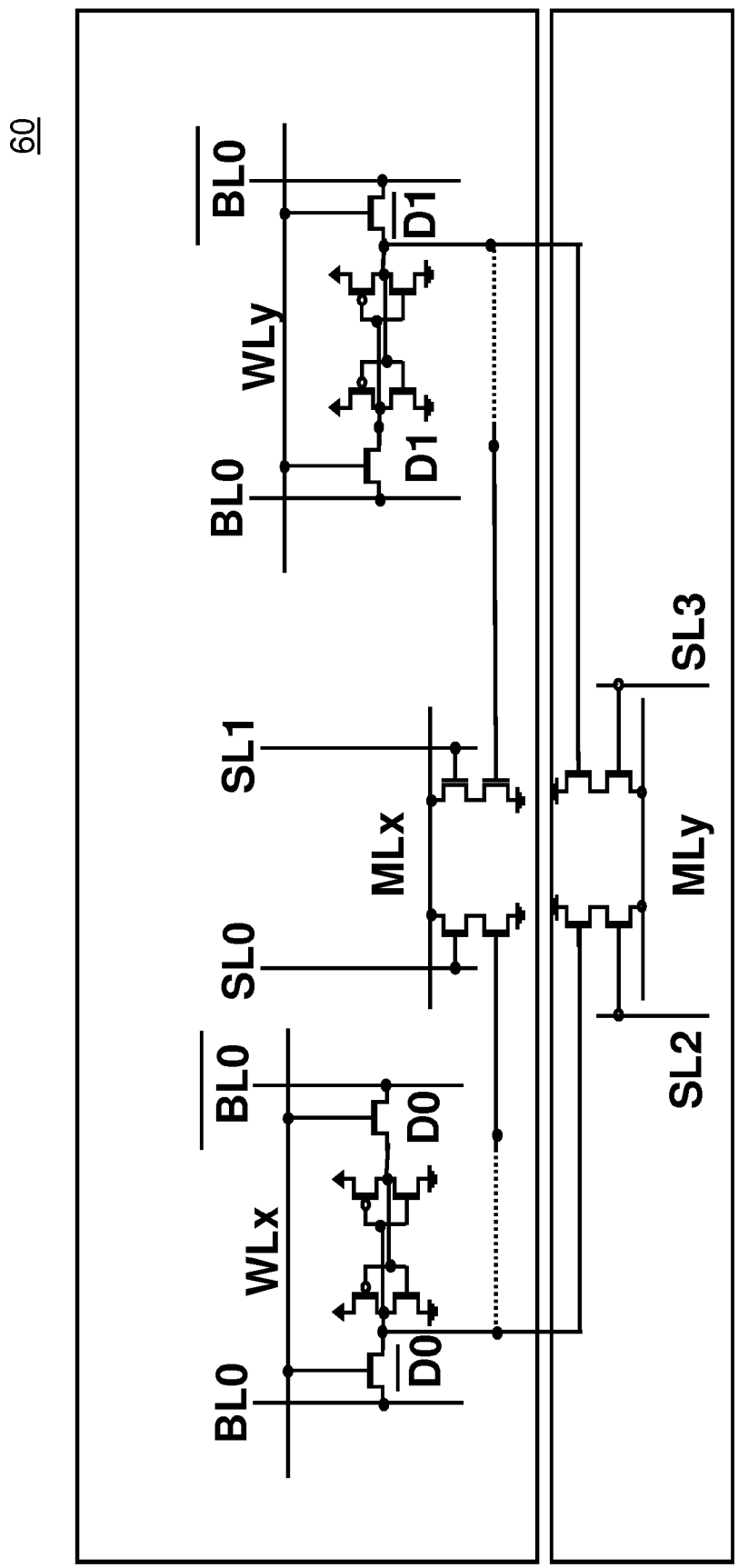
FIG. 6 illustrates a simplified block diagram of a configurable CAM cell design that is configured as ternary CAM including a single ternary CAM cell with two outputs in an exemplary embodiment of the invention.

FIG. 6 illustrates the configurable CAM cell design of an exemplary embodiment of the invention configured as a ternary CAM design 60. The configurable CAM cell design may connect data storage nodes $\overline{D0}$ and $\overline{D1}$ to comparison circuitry associated with search-lines SL0 and SL1 and match-line MLx in a first sub-cell by a selected metal overlay (dotted lines), to form a first ternary CAM output, e.g., a first search port. The configurable CAM cell design may also form comparison circuitry for a second ternary CAM design output, e.g., a second search port, in a second sub-cell. Storage data nodes, D0 and D1, may also be connected in parallel by the selected metal overlay to the comparison circuitry of the second sub-cell associated with search-lines SL2 and SL3 and match-line MLy, to form a second ternary CAM output, e.g. the second search port.

Figure 7:
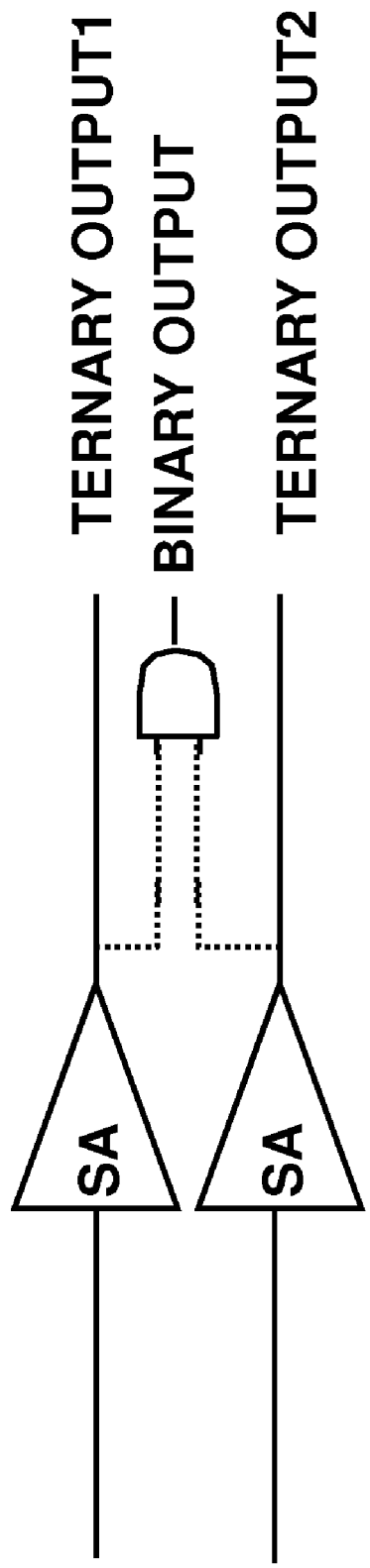
FIG. 7 illustrates a simplified block diagram of outputs of the configurable CAM cell design configured either as two sensed binary CAM cell outputs connected to an AND gate for binary CAM output, or as the two outputs of a ternary CAM connected to sense amplifiers and output as two ternary CAM outputs in an exemplary embodiment of the invention.

As shown in FIG. 7, when configured as binary CAM design 50, the output of the sensed match-line MLx of the first binary CAM cell may be AND-ed by an AND gate with the output of the sensed match-line MLy of the second binary CAM cell by the selected metal overlay (dotted lines) to provide an AND-ed binary CAM output for the two binary CAM cells. As also shown in FIG. 7, when configured as ternary CAM design 60, the output of sensed match-line MLx of the ternary CAM design may provide a first ternary CAM output, e.g., a first port, while the output of sensed match-line MLy of the configured ternary CAM design may also provide a second ternary CAM output, e.g., a second port, by the selected metal overlay design.

Figure 8:
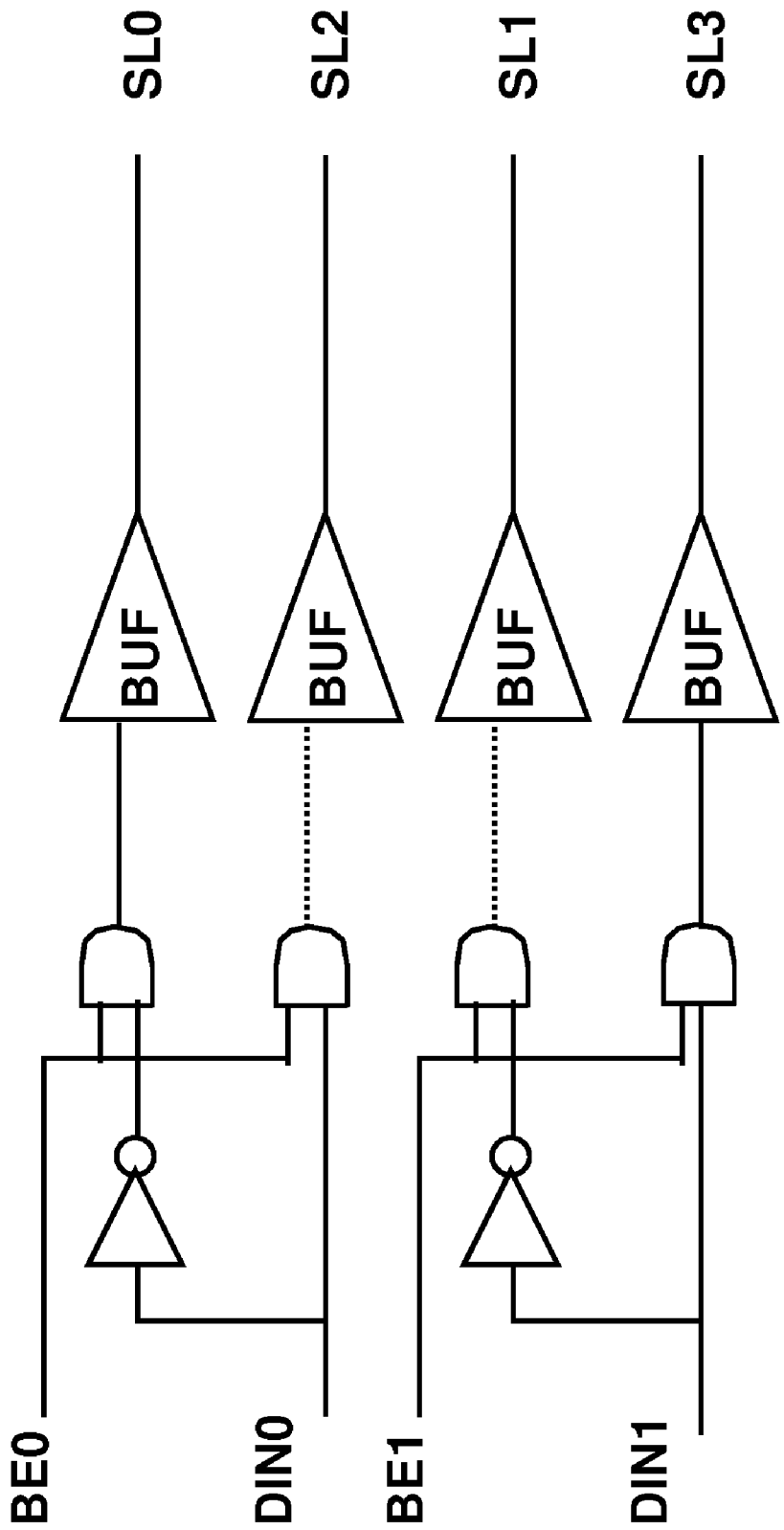
FIG. 8 illustrates a simplified block diagram of inputs to a configurable CAM cell design configured as two binary CAM cells including bit line, storage node, and search-line inputs in an exemplary embodiment of the invention.

FIG. 8 reflects the DATA IN configuration of the selected metal overlay for the binary CAM design 50. In an exemplary embodiment of the invention, the input of data storage node DIN0 may connect with buffered search-lines SL0 and SL2 of each of the two binary CAM cells associated with match-lines MLx and MLy, respectively, and the input of data storage node DIN1 may connect with buffered search-lines SL1 and SL3 of each of the two binary CAM cells, associated with match-lines MLx and MLy, respectively.

Figure 9:
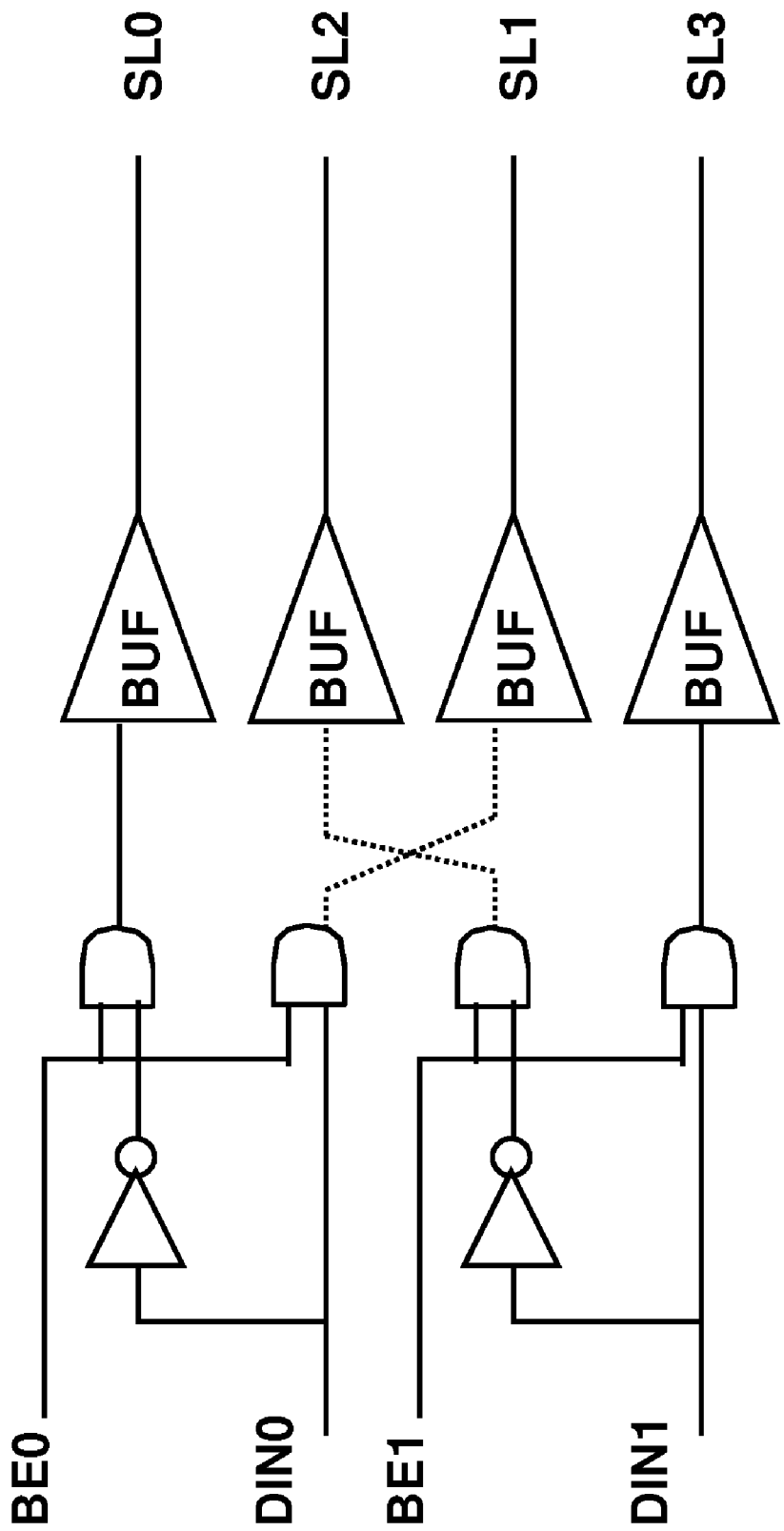
FIG. 9 illustrates a simplified block diagram of inputs to a configurable CAM cell design configured as ternary CAM including bit line, storage node, and search-line inputs in an exemplary embodiment of the invention.

FIG. 9 reflects the DATA IN configuration of the selected metal overlay for the ternary CAM design 60. In an exemplary embodiment of the invention, the inputs to data storage nodes DIN0 and DIN1 may be connected to each of the two ternary CAM design outputs, associated with buffered search-lines SL0-SL1 and buffered search-lines SL2-SL3, respectively.

As is seen in FIGS. 5 and 6, the configurable CAM design of the invention may allow the binary CAM design 50, comprising a single search port for two binary CAM cells, to be configured in an area approximately equal to one ternary CAM cell design 60 of the invention. It is also obvious that the ternary CAM design 60 of the invention may provide a two search-port ternary CAM design, which may provide half the bit-count but twice the throughput of the binary CAM design of the invention. Both of these configurations, i.e., binary CAM design and ternary CAM design, may be provided by selection of a corresponding metal overlay that connects the storage data nodes of an SRAM-based ternary CAM cell to additional comparison circuitry of a second sub-cell design, to the output connections of match-line outputs, and to connections between data storage inputs and search-lines, as explained immediately above.

A conventional single ternary CAM cell, including two storage elements and two bit-compare circuits, can be used as a ternary CAM with no further configuration changes needed, or as a binary CAM cell for storing binary CAM data. However, implementing this binary CAM cell on a conventional single ternary CAM cell is inefficient because a conventional binary CAM could have been implemented with but a single storage element and a single bit-compare circuit. Hence, implementing binary CAM on a conventional single ternary CAM cell wastes six transistors of the conventional single ternary CAM cell.

Two conventional binary CAM cells, including two storage elements and two bit-compare circuits, can be used as binary CAM with no further configuration needed, or as a ternary CAM cell for storing ternary data across the two binary CAM cells. However, implementing this ternary CAM cell on two conventional binary CAM cells is inefficient because only two of the four bit-compare circuits of the two conventional binary CAM cell are used. Hence, implementing ternary CAM on two conventional binary CAM cells wastes 4 transistors of the two conventional binary CAM cells.

However, exemplary embodiments of the invention use all of the transistors of the configurable CAM cell designs of FIGS. 5 and 6 to implement either a single search-port binary CAM that has twice the bit-count of the configured ternary CAM, or a two search-port ternary CAM that has half the bit-count but twice the throughput of the configured binary CAM.

Figure 10:
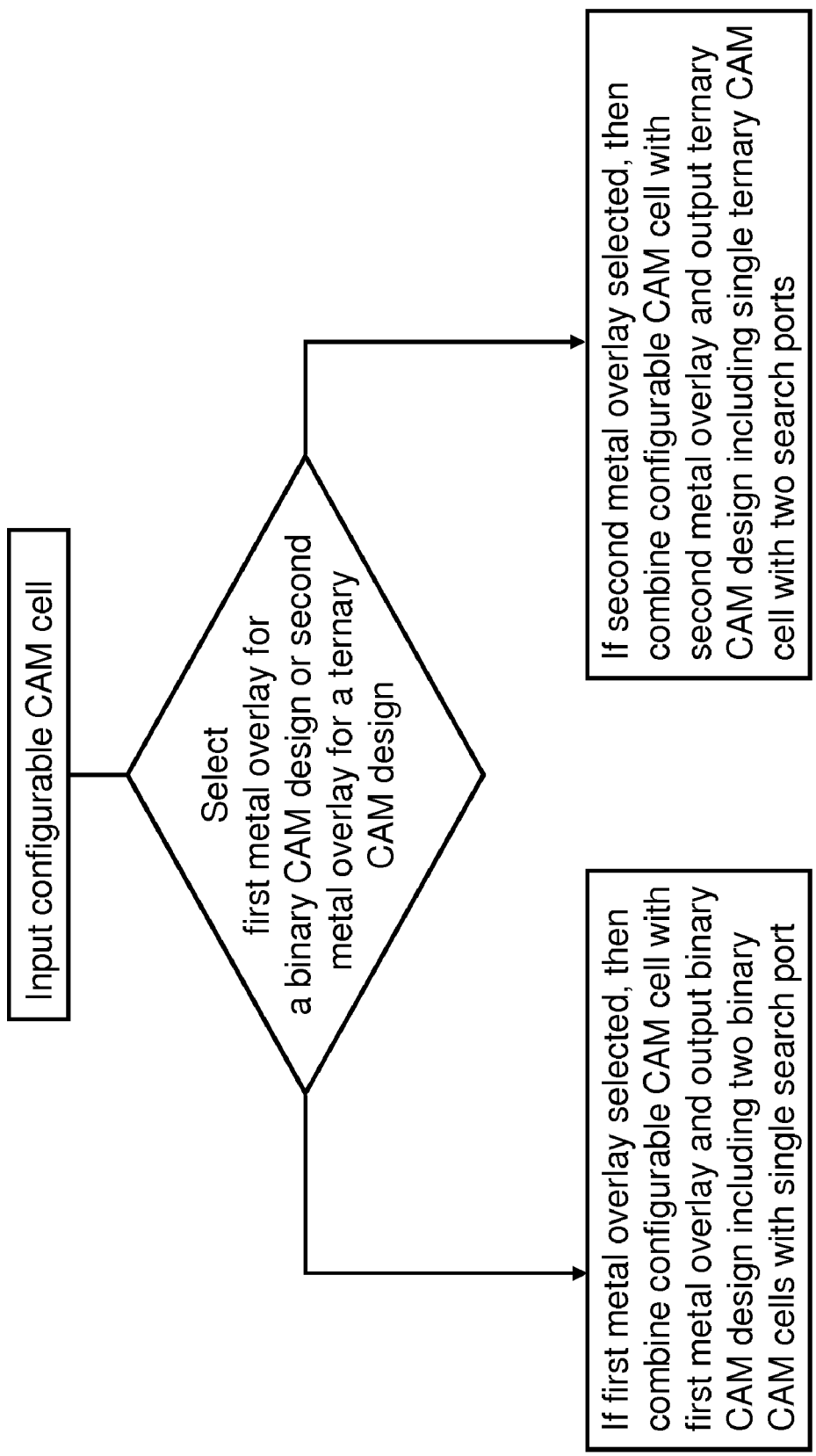
FIG. 10 illustrates a flow diagram of a computer-implemented method of practicing an exemplary embodiment of the invention.

FIG. 10 illustrates a flow diagram of a computer-implemented method of practicing an exemplary embodiment of the invention 100. Initially, a configurable CAM cell design is input 110. Either a first metal overlay design is selected for a binary CAM design, or a second metal overlay design is selected for a ternary CAM design 120. If the first metal overlay is selected, then the configurable CAM cell design is combined with the first metal overlay to produce a binary CAM design including two binary CAM cells, and the binary CAM design is outputted 130. If the second metal overlay is selected, then the configurable CAM cell design is combined with the second metal overlay to produce a ternary CAM design including a single ternary CAM cell with two outputs, and the ternary CAM design is outputted.

The embodiments of the invention can take the form of an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 11:
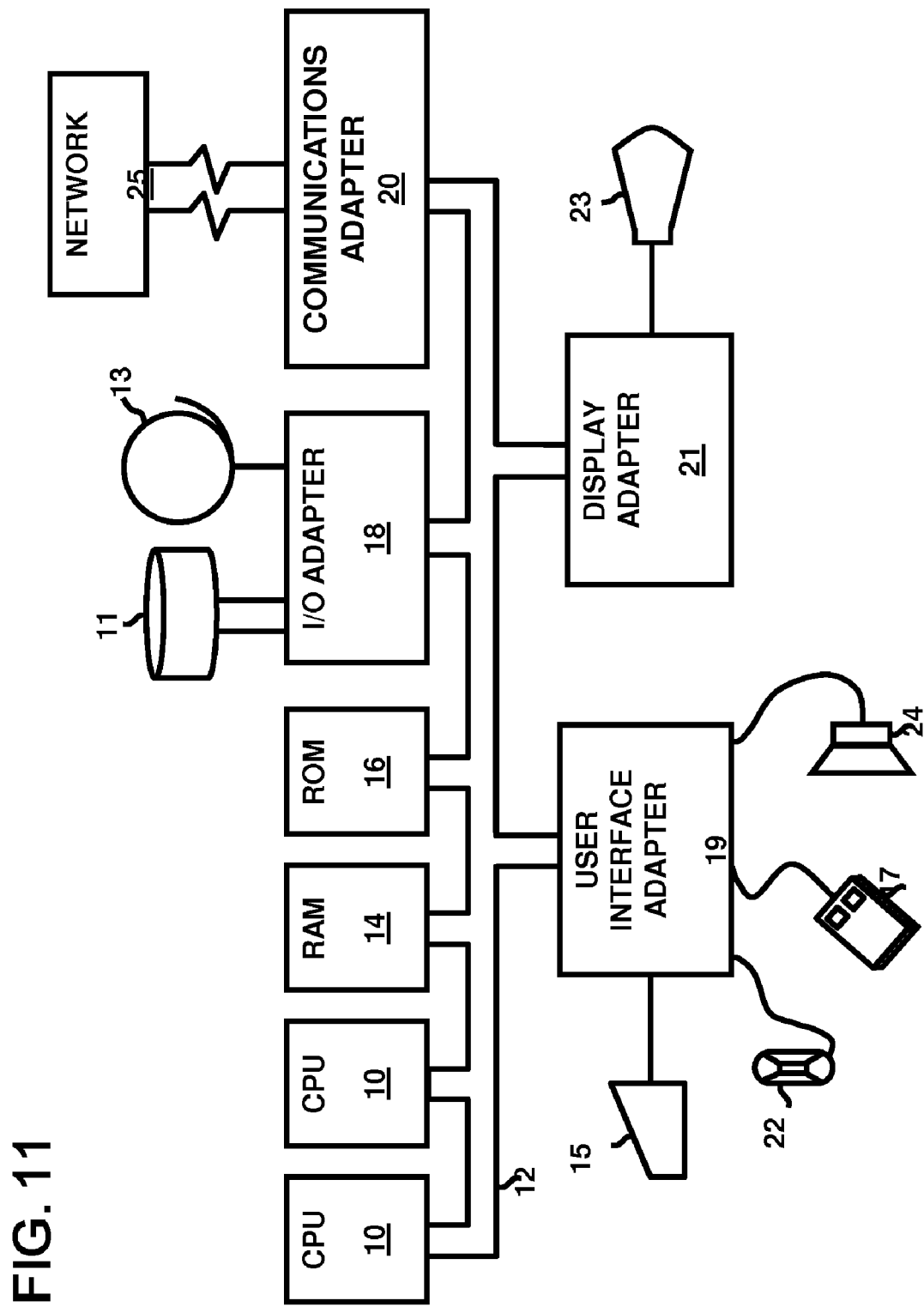
FIG. 11 illustrates a simplified block diagram of a representative hardware environment of an exemplary embodiment of the invention.

A representative hardware environment for practicing the embodiments of the invention is depicted in FIG. 11. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A computer-implemented method for producing a configurable content-addressable memory (CAM) cell design, said method comprising:
   inputting, to a computer, a configurable CAM cell design, said configurable CAM cell design comprising:
      a first sub-cell design comprising a static random access memory (SRAM)-based ternary CAM cell connected to a first pair of search-lines and a first match-line output; and
      a second sub-cell design comprising comparison circuitry connected to a second pair of search-lines and a second match-line output;
   selecting, by using said computer, one of a first metal overlay design and a second metal overlay design to electrically connect said first and second sub-cell designs as one of a binary CAM design including two binary CAM cells with a single search port, and a ternary CAM design including a single ternary CAM cell with two search ports, respectively;
      wherein said first metal overlay design comprises:
         connections between storage data nodes of a first binary CAM cell, and said first match-line output and said second match-line output; and
         connections between storage data nodes of a second binary CAM cell, and said first match-line output and said second match-line output; and
      wherein said second metal overlay design comprises:
         parallel connections between storage data nodes producing a first ternary CAM cell output and a second ternary CAM cell output, and said first match-line output and said second match-line output, respectively; and
   outputting, by said computer, one of said binary CAM design including two binary CAM cells with a single search port, and said ternary CAM cell design including a single ternary CAM cell with two search ports according to said selecting of said first or said second metal overlay design, respectively.

2. The method of claim 1, wherein said first metal overlay design further comprises
   an AND gate that receives an output from each of said two binary CAM cells.

3. The method of claim 2, wherein said first metal overlay design further comprises connections between inputs to data storage nodes of said first binary CAM cell to said first and second match-line outputs, and connections between inputs to data storage nodes of said second binary CAM cell to said first and second match-line outputs.

4. The method of claim 1, wherein said second metal overlay design further comprises said first and second match-line outputs connecting to a first search port and a second search port, respectively, of said configured single ternary CAM cell with two search ports.

5. The method of claim 4, wherein said second metal overlay design further comprises connections between inputs to data storage nodes, producing a first ternary CAM cell output and a second ternary CAM cell output, and said first and second match-line outputs, respectively.

6. The method of claim 1, wherein said first sub-cell design comprises 16 transistors.

7. The method of claim 1, wherein said second sub-cell design comprises 4 transistors.

8. A computer system for producing a configurable content-addressable memory (CAM) design, said system comprising:
a memory configured to:
store said configurable CAM cell design, said configurable CAM cell design comprising:
a first sub-cell design comprising a static random access memory (SRAM)-based ternary CAM cell connected to a first pair of search-lines and a first match-line output; and
a second sub-cell design comprising comparison circuitry connected to a second pair of search-lines and a second match-line output; and
a processor configured to:
select one of a first metal overlay design and a second metal overlay design to electrically connect said first and second sub-cell designs as one of a binary CAM design including two binary CAM cells with a single search port, and a ternary CAM design including a single ternary CAM cell with two search ports, respectively;
wherein said first metal overlay comprises:
connections between storage data nodes of a first binary CAM cell, and said first match-line output and said second match-line output; and
connections between data storage nodes of a second binary CAM cell, and said first match-line output and said second match-line output; and
wherein said second metal overlay comprises:
parallel connections between storage data nodes producing a first ternary CAM cell output and a second ternary CAM cell output, and said first match-line output and said second match-line output, respectively; and
output one of said binary CAM design including two binary CAM cells with a single search port, and said ternary CAM cell design including a single ternary CAM cell with two search ports according to a selection of said first or said second metal overlay design, respectively.

9. The system of claim 8, wherein said first metal overlay design further comprises
an AND gate that receives an output from each of said two binary CAM cells.

10. The system of claim 9, wherein said first metal overlay design further comprises connections between inputs to data storage nodes of said first binary CAM cell to said first and second match-line outputs, and connections between inputs to data storage nodes of said second binary CAM cell to said first and second match-line outputs.

11. The system of claim 8, wherein said second metal overlay design further comprises said first and second match-line outputs connecting to a first search port and a second search port, respectively, of said configured single ternary CAM cell with two search ports.

12. The system of claim 11, wherein said second metal overlay design further comprises connections between inputs to data storage nodes, producing a first ternary CAM cell output and a second ternary CAM cell output, and said first and second match-line outputs, respectively.

13. The system of claim 8, wherein said first sub-cell design comprises 16 transistors.

14. The system of claim 8, wherein said second sub-cell design comprises 4 transistors.

15. A computer program storage medium readable by a computer, tangibly embodying a computer program of instructions executable by said computer to perform a method for producing a configurable content-addressable memory (CAM) design, said method comprising:
inputting a configurable CAM cell design, said configurable CAM cell design comprising:
a first sub-cell design comprising a static random access memory (SRAM)-based ternary CAM cell connected to a first pair of search-lines and a first match-line output; and
a second sub-cell design comprising comparison circuitry connected to a second pair of search-lines and a second match-line output;
selecting one of a first metal overlay design and a second metal overlay design to electrically connect said first and second sub-cell designs as one of a binary CAM design including two binary CAM cells with a single search port, and a ternary CAM design including a single ternary CAM cell with two search ports, respectively;
wherein said first metal overlay design comprises:
connections between storage data nodes of a first binary CAM cell, and said first match-line output and said second match-line output; and
connections between storage data nodes of a second binary CAM cell, and said first match-line output and said second match-line output; and
wherein said second metal overlay comprises:
parallel connections between storage data nodes, corresponding to a first ternary CAM cell output and a second ternary CAM cell output, and said first match-line output and said second match-line output, respectively; and
outputting one of said binary CAM design including two binary CAM cells with a single search port, and said ternary CAM cell design including a single ternary CAM cell with two search ports, according to said selecting of said first or said second metal overlay design, respectively.

16. The computer program storage medium of claim 15, wherein said first metal overlay design further comprises an AND gate that receives an output from each of said two binary CAM cells.

17. The computer program storage medium of claim 16, wherein said first metal overlay design further comprises connections between inputs to data storage nodes of said first binary CAM cell to said first and second match-line outputs, and connections between inputs to data storage nodes of said second binary CAM cell to said first and second match-line outputs.

18. The computer program storage medium of claim 15, wherein said second metal overlay design further comprises said first and second match-line outputs connecting to a first search port and a second search pot, respectively, of said configured single ternary CAM cell with two search ports.

19. The computer program storage medium of claim 18, wherein said second metal overlay design further comprises connections between inputs to data storage nodes, producing a first ternary CAM cell output and a second ternary CAM cell output, and said first and second match-line outputs, respectively.

* * * * *